US012739990B2

(12) United States Patent
Tsorng et al.

(10) Patent No.: US 12,739,990 B2
(45) Date of Patent: Sep. 15, 2026

(54) SUPPORTING ASSEMBLY FOR COMPUTING SYSTEM AND TELECOMMUNICATION SYSTEM INCLUDING THE SAME

(71) Applicant: Quanta Computer Inc., Taoyuan City (TW)

(72) Inventors: Yaw-Tzorng Tsorng, Taoyuan City (TW); Ming-Lung Wang, Taoyuan City (TW); Nan-Chun Wu, Taoyuan City (TW); Wei-Kang Tsai, Taoyuan City (TW); Pei-Jung Hsieh, Taoyuan City (TW)

(73) Assignee: Quanta Computer Inc., Taoyuan City (TW)

( * ) Notice: Subject to any disclaimer, the term of this patent is extended or adjusted under 35 U.S.C. 154(b) by 598 days.

(21) Appl. No.: 18/225,306

(22) Filed: Jul. 24, 2023

(65) Prior Publication Data

US 2025/0040077 A1 Jan. 30, 2025

(51) Int. Cl.
*H05K 5/02* (2006.01)
*H05K 7/18* (2006.01)

(52) U.S. Cl.
CPC ......... *H05K 5/0234* (2013.01); *H05K 5/0204* (2013.01); *H05K 7/186* (2013.01)

(58) Field of Classification Search
CPC .... H05K 5/0204; H05K 5/0234; H05K 7/186; G06F 1/166
See application file for complete search history.

(56) References Cited

U.S. PATENT DOCUMENTS 7,780,126 B2 * 8/2010 Law ........................ F16M 11/10 396/428
7,784,752 B2 * 8/2010 Tang ........................ G06F 1/166 248/677
8,139,357 B2 * 3/2012 Trang ...................... G06F 1/203 400/681
8,960,634 B2 * 2/2015 Le Gette .............. F16M 11/041 248/176.1
9,784,406 B1 * 10/2017 Lin .......................... G06F 1/166
11,839,048 B2 * 12/2023 Chen ........................ F16B 2/065
(Continued)

FOREIGN PATENT DOCUMENTS

EP 2727687 A1 * 5/2014 ........... H05K 5/0234
TW M649840 U * 12/2023 ............. F16M 13/00

*Primary Examiner* — Andrew Roersma
(74) *Attorney, Agent, or Firm* — Nixon Peabody LLP

(57) ABSTRACT

A supporting assembly for an outdoor computing system is disclosed. The supporting assembly includes a holder having a base from which a peripheral wall extends and a foldable unit mechanically attached to the holder within the peripheral wall. The foldable unit has a first side, a second side connected to the first side and movable relative to the first side, and a third side connected to the first side and movable relative to the first side. The supporting assembly further includes a plurality of springs including a first spring and a second spring, the first spring being attached between the first side and the second side, the second spring being attached between the first side and the third side. The foldable unit is configured to change between an open configuration and a closed configuration, the foldable unit being maintained in the open configuration solely by the plurality of springs.

17 Claims, 12 Drawing Sheets

(56) References Cited

U.S. PATENT DOCUMENTS

| | | | | |
|---|---|---|---|---|
| 12,313,213 | B2 * | 5/2025 | Serna | F16M 11/38 |
| 12,396,122 | B2 * | 8/2025 | Tsorng | H05K 7/2039 |
| 12,526,941 | B2 * | 1/2026 | Lu | F16M 13/022 |
| 2008/0245945 | A1 * | 10/2008 | Law | F16M 13/005<br>248/168 |
| 2015/0282355 | A1 * | 10/2015 | Wang | A47B 91/005<br>74/63 |
| 2016/0252207 | A1 * | 9/2016 | Hollenberg | F16M 11/38<br>73/866.5 |
| 2018/0299923 | A1 * | 10/2018 | Kuo | G06F 1/1656 |

* cited by examiner

SUPPORTING ASSEMBLY FOR COMPUTING SYSTEM AND TELECOMMUNICATION SYSTEM INCLUDING THE SAME

FIELD OF THE INVENTION

The present invention relates generally to a supporting assembly for an outdoor computing system, and more specifically, to a supporting assembly including a foldable unit configured to change between an open configuration and a closed configuration.

BACKGROUND OF THE INVENTION

In general, a 5G outdoor system is placed in an outdoor environment for storage, being exposed to the harsh outdoor environment. Thus, the surface of the 5G outdoor system may be in direct contact with the ground, shelves, assembly desk, and other storage locations. Such direct contact of the surfaces may cause damages to the 5G outdoor system. For example, damages to the exterior surface of the 5G outdoor system include paint peeling and scratches to the exterior surface of the system. Such damages may eventually make the 5G outdoor system inoperable.

Therefore, a need exists for solving the problem of causing damages to the exterior surface of the 5G outdoor system due to direct contact between surfaces. A need also exists for providing an easy and convenient mechanism to prevent direct contact between the exterior surface of the 5G outdoor system and the surface of the storage location.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

In view of the above-described problem with the conventional way of storing 5G outdoor systems that is prone to damages to the exterior surface of the 5G outdoor system, a supporting assembly is provided to protect the exterior surface from damages. By employing a foldable unit with a spring system, the supporting assembly can be easily converted to a tripod structure without requiring use of tools. In particular, by placing the foldable unit in the open/unfolded configuration, the tripod structure provides a space between the exterior surface of the 5G outdoor system to which the supporting assembly is coupled and the surface of the storage place. The supporting assembly makes it possible to store the 5G outdoor system without direct contact between the exterior surface of the 5G outdoor system and the surface of the storage place. Therefore, use of the supporting assembly for placement of the 5G outdoor system can prevent damages to the exterior surface of the 5G outdoor system. Although the 5G outdoor system is exemplified as a communication system throughout the specification, the supporting assembly can be used with any type of communication system or computing device.

According to certain aspects of the present disclosure, a supporting assembly for an outdoor computing system is disclosed. According to various embodiments, the supporting assembly includes a holder having a base from which a peripheral wall extends and a foldable unit mechanically attached to the holder within the peripheral wall. The foldable unit has a plurality of sides that include a first side, a second side connected to the first side, the second side being movable relative to the first side, and a third side connected to the first side, the third side being movable relative to the first side. The supporting assembly further includes a plurality of springs including a first spring and a second spring, the first spring being attached between the first side and the second side, the second spring being attached between the first side and the third side. The foldable unit is configured to change between an open configuration and a closed configuration, the foldable unit being maintained in the open configuration solely by the plurality of springs.

In various embodiments, the peripheral wall overlaps only a portion of the plurality of sides in a generally perpendicular direction relative to the base.

In various embodiments, each of the second side and the third side is generally perpendicular to the first side when the foldable unit is in the open configuration.

In various embodiments, each of the second side and the third side is parallel to the first side when the foldable unit is in the closed configuration.

In various embodiments, each of the plurality of springs is a torsion spring.

In various embodiments, each torsion spring has a first leg and a second leg, the first leg being generally perpendicular to the second leg in the open configuration, the first leg being generally parallel to the second leg in the closed configuration.

In various embodiments, the first leg of the first spring is attached to the first side and the second leg of the first spring is attached to the second side; and the first leg of the second spring is attached to the first side and the second leg of the second spring is attached to the third side.

In various embodiments, the plurality of springs further includes a third spring, the third spring being a torsion spring and including respective first and second legs, the first leg of the third spring being attached to the first side, the second leg of the third spring being attached to the base of the holder.

In various embodiments, the supporting assembly further includes an elastic member, a first end of the elastic member coupled to the peripheral wall of the holder.

In various embodiments, the elastic member protruding from the peripheral wall of the holder is elongated such that the elastic member is parallel to the second and third sides of the foldable unit.

In various embodiments, the supporting assembly further includes a latch coupled to a second end of the elastic member.

In various embodiments, the first side of the foldable unit that is in the open configuration is configured to tilt toward the base of the holder in response to pressure applied to the foldable unit or the first side of the foldable unit.

In various embodiments, the second side and the third side are configured to be folded toward the first side as the first side is tilted in response to the pressure.

In various embodiments, coils of the first, second, and third springs are wound when the second side and the third side are folded.

In various embodiments, the foldable unit placed in the closed configuration in response to the pressure is configured to contact and push the latch such that the elastic member is compressed, the latch moves from a first position to a second position, and the foldable unit is eventually locked by the latch placed on top of the folded foldable unit when the latch returns to the first position.

In various embodiments, the foldable unit that is in the closed configuration is configured to return to the open configuration in response to release of the latch, the latch released in response to pressure applied to the latch and compressing the elastic member.

In various embodiments, the second side and the third side of the foldable unit are configured to be unfolded to place the foldable unit in the open configuration in response to unwinding of coils of the first, second, and third springs.

According to other aspects of the present disclosure, a telecommunication system is disclosed. According to various embodiments, the telecommunication system includes an outdoor computing/communication device; and the supporting assembly coupled to a side of the outdoor computing/communication device.

In various embodiments, the supporting assembly is configured to prevent direct contact between an exterior surface of the outdoor computing/communication device and a surface on which the outdoor computing/communication device is placed.

In various embodiments, the supporting assembly coupled to the outdoor computing/communication device is placed on the surface with the foldable unit in the open configuration.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

Figure 1A:
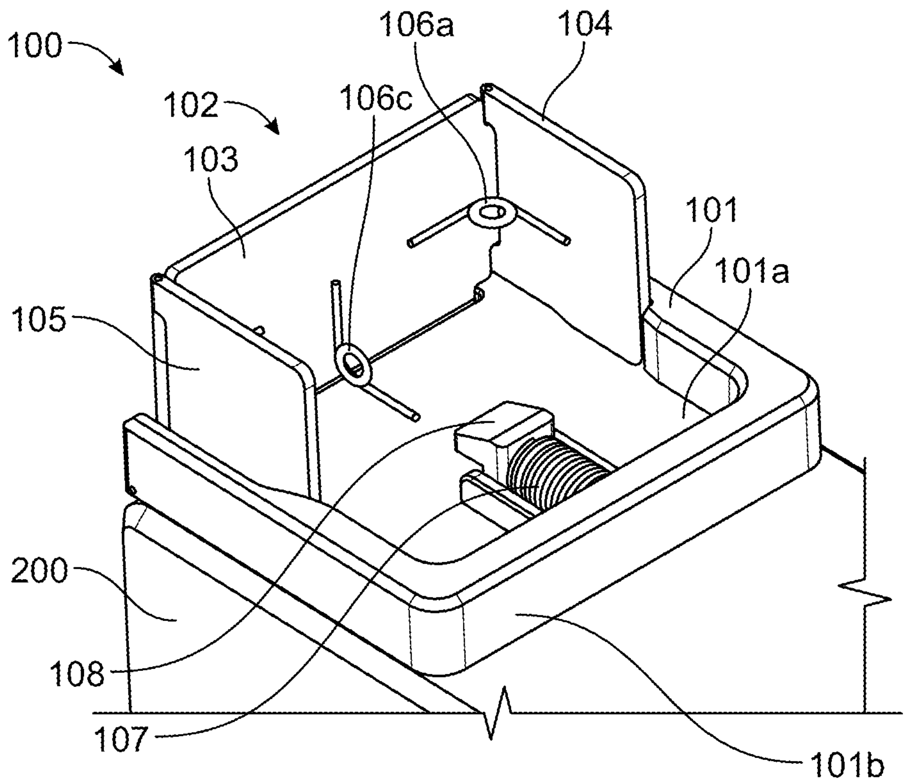
FIGS. 1A and 1B are perspective views of a supporting assembly according to certain aspects of the present disclosure.

Elements in the figures are illustrated for simplicity and clarity and have not necessarily been drawn to scale. For example, the dimensions and/or relative positioning of some of the elements in the figures may be exaggerated relative to other elements to help improve understanding of various features.

While the present disclosure is susceptible to various modifications and alternative forms, specific implementations have been shown by way of example in the drawings and will be described in further detail herein. It should be understood, however, that the present disclosure is not intended to be limited to the particular forms disclosed. Rather, the present disclosure is to cover all modifications, equivalents, and alternatives falling within the spirit and scope of the present disclosure as defined by the appended claims.

DETAILED DESCRIPTION

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 1B:
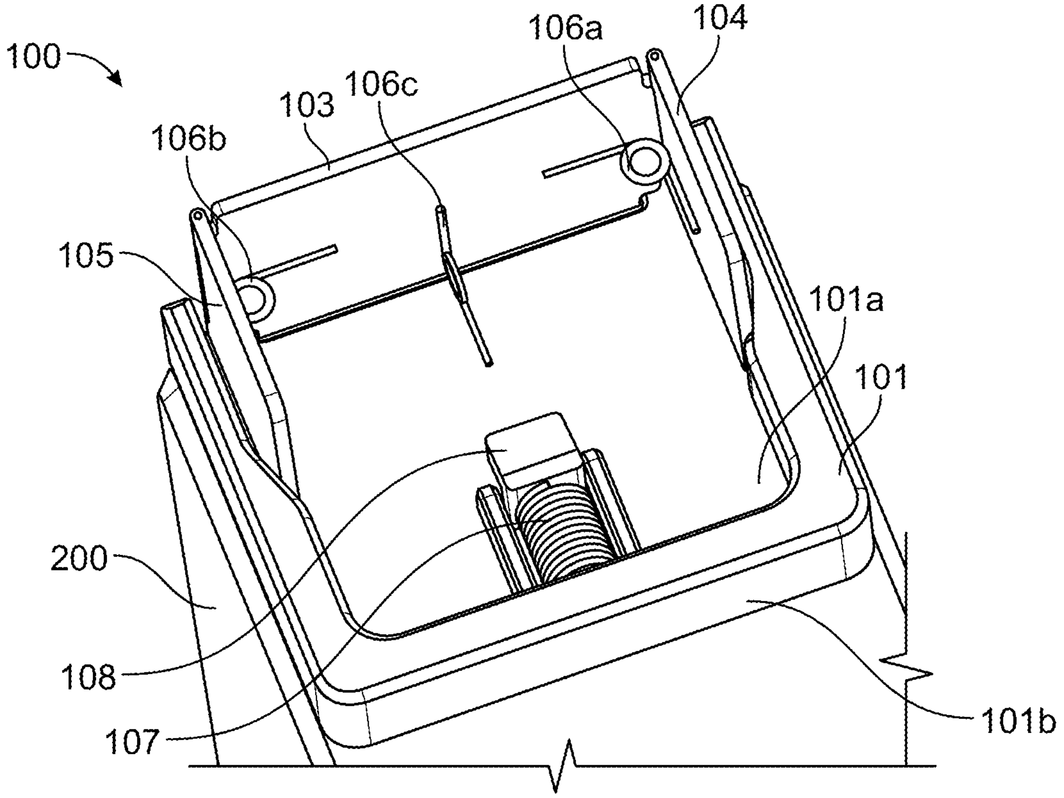

A supporting assembly 100 for an outdoor computing/communication device 200 according to various embodiments of the present invention is shown in FIGS. 1A and 1B. Referring to FIGS. 1A and 1B, in various embodiments, the supporting assembly 100 includes a holder 101 having a base 101*a* from which a peripheral wall 101*b* extends. In some embodiments, the holder 101 is made of metal such that abrasion, crack, and distortion are prevented. In some embodiments, the holder 101 is fixed on one side of a computing device 200 including a 5G outdoor system. In FIGS. 1A and 1B, the side of the outdoor computing/communication device 200 is shown partially.

Referring to FIGS. 1A and 1B, in various embodiments, the supporting assembly 100 further includes a foldable unit 102 mechanically attached to the holder 101 within the peripheral wall 101*b*. As shown in FIGS. 1A and 1B, the foldable unit 102 has a plurality of sides that includes a first side 103, a second side 104 connected to the first side 103, and a third side 105 connected to the first side 103. The second side 104 of the foldable unit 102 is movable relative to the first side 103, and the third side 105 is also movable relative to the first side 103. In some embodiments, the plurality of sides 103, 104, 105 is made of metal such that abrasion, crack, and distortion are prevented. The plurality of sides 103, 104, 105 is used to support the outdoor computing/communication device 200 and to protect the exterior surface of the outdoor computing/communication device 200 from damages.

Figure 2A:
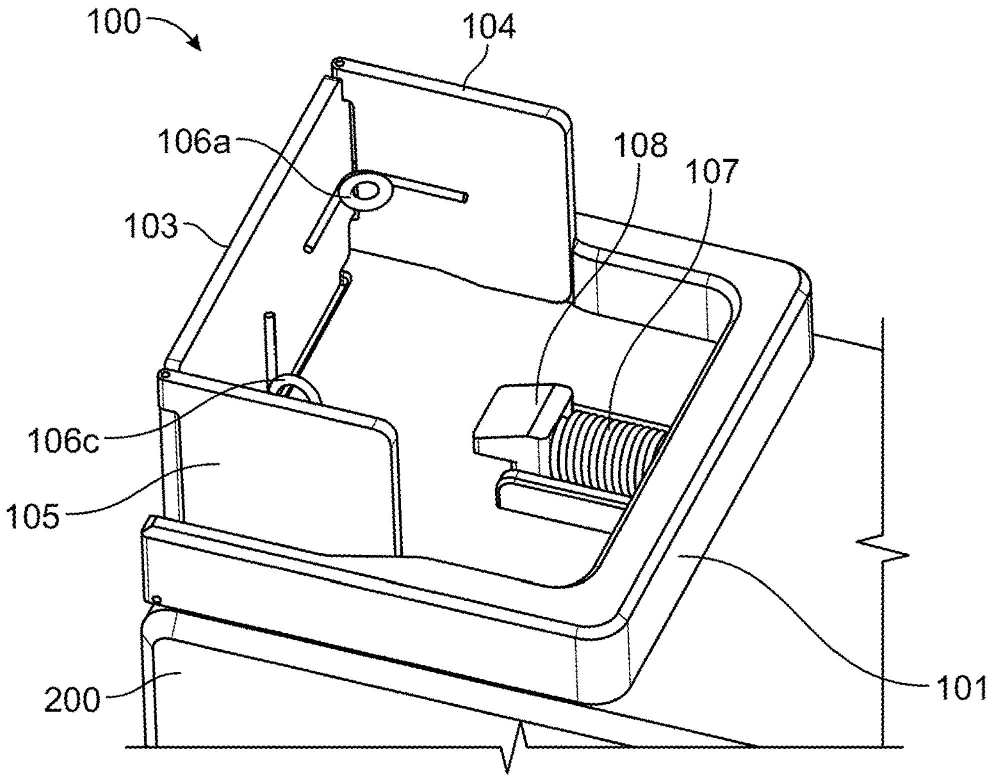
FIGS. 2A-2E illustrate steps of folding or closing a foldable unit of a supporting assembly, according to certain aspects of the present disclosure.
Figure 2B:
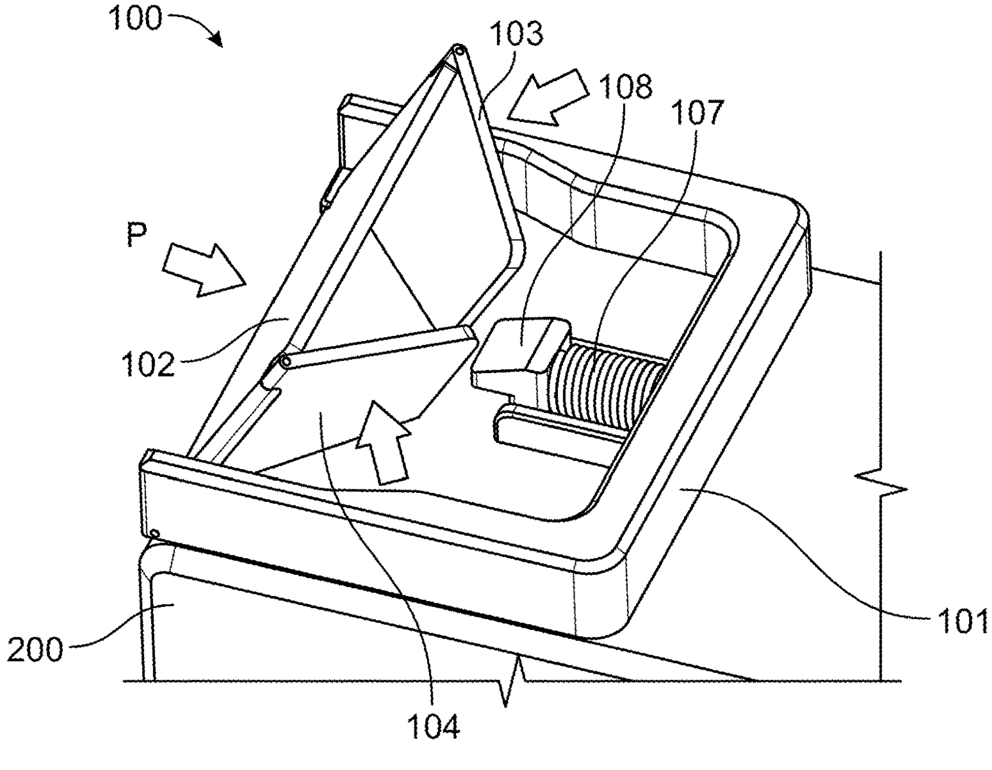
Figure 2C:
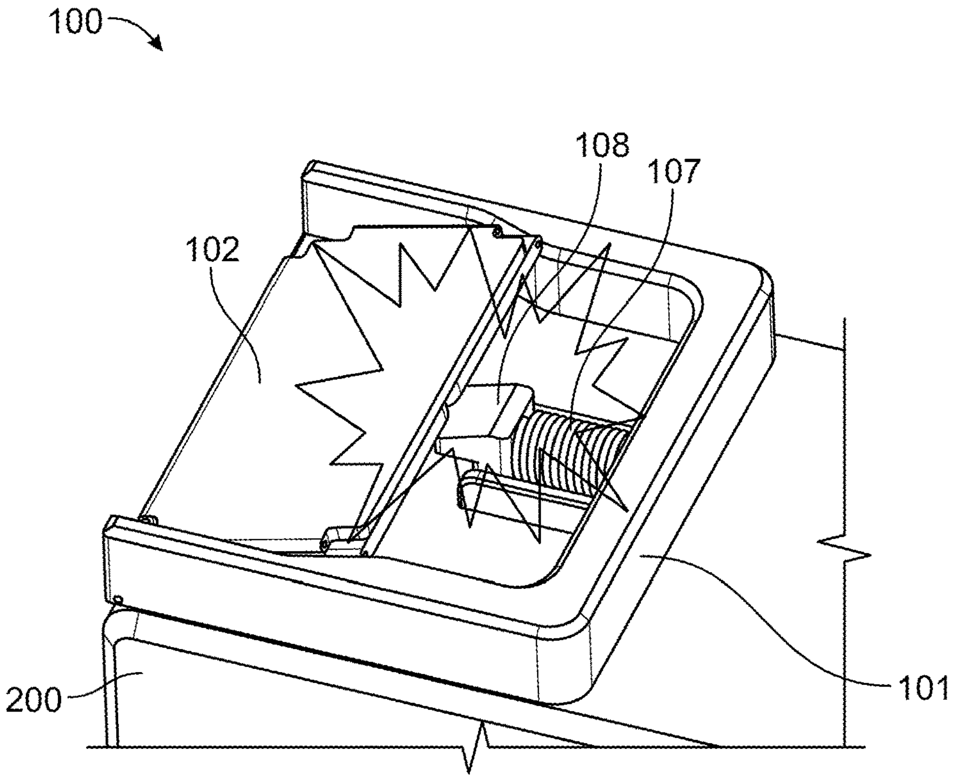
Figure 2D:
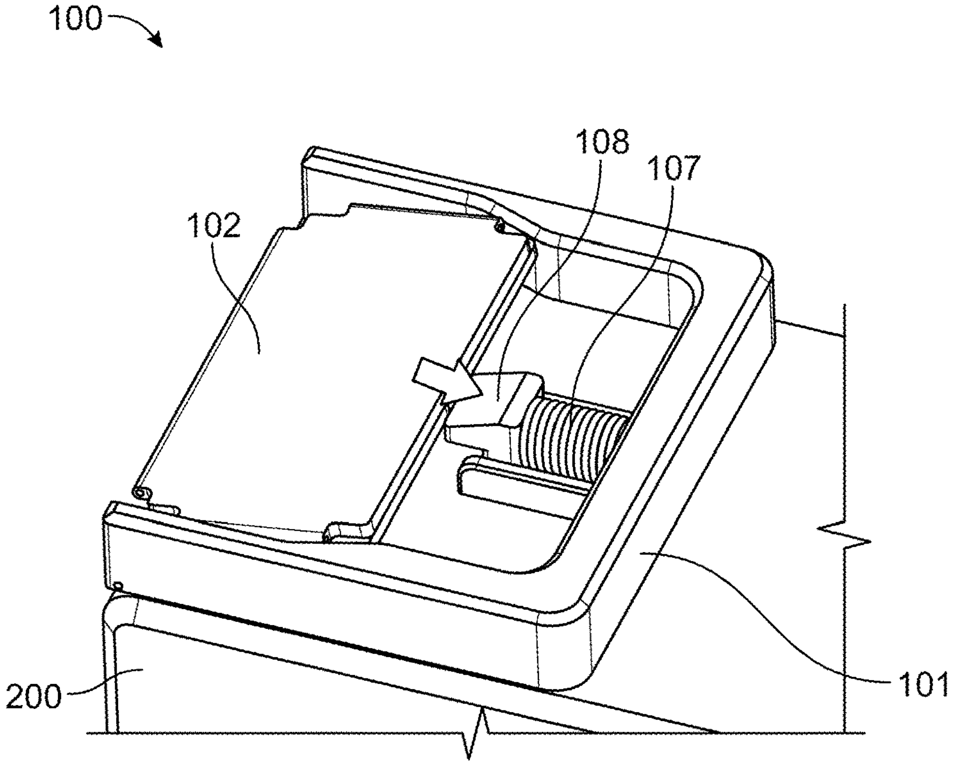
Figure 2E:
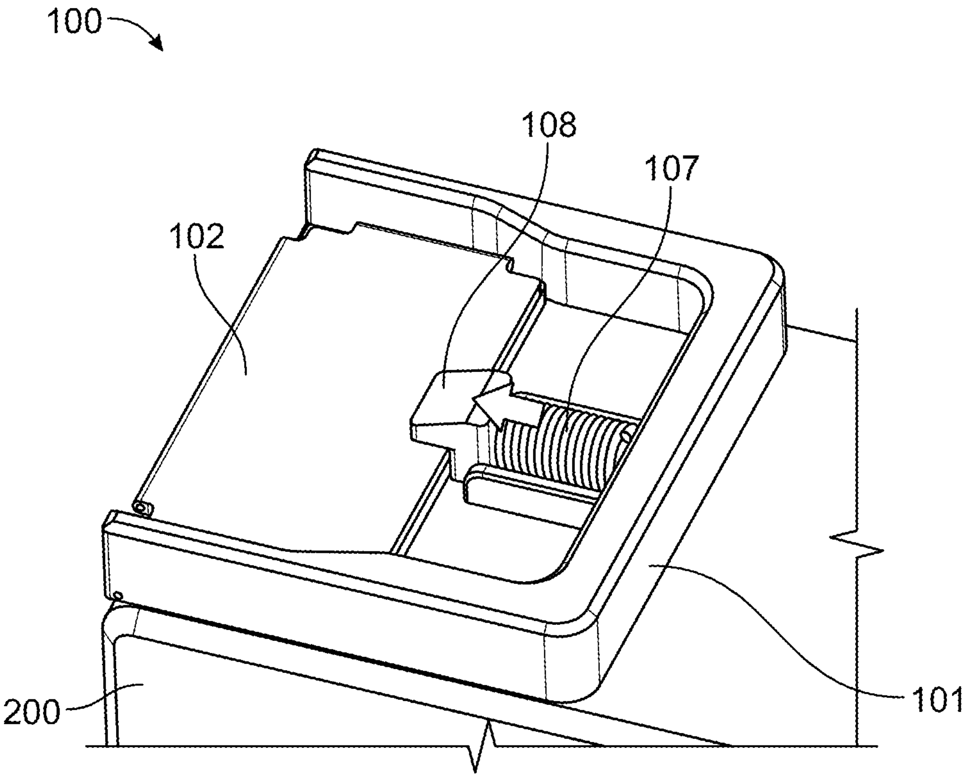

Referring to FIGS. 1A and 1B, in various embodiments, the supporting assembly 100 further includes a plurality of springs including a first spring 106*a* and a second spring 106*b*. In some embodiments, the first spring 106*a* and second spring 106*b* are made of metal such that abrasion, crack, and distortion are prevented. The first spring 106*a* is attached between the first side 103 and the second side 104, and the second spring 106*b* is attached between the first side 103 and the third side 105. As exemplified in FIGS. 2A-2E, the foldable unit 102 is configured to change between an open configuration (FIGS. 1A, 1B, and 2A) and a closed configuration (FIG. 2E). The foldable unit 102 is maintained in the open configuration solely by the plurality of springs 106*a*, 106*b*. When the foldable unit 102 is folded, the tension of the first spring 106*a* and second spring 106*b* increases.

As shown in FIGS. 1A and 1B, the peripheral wall 101*b* overlaps only a portion of the plurality of sides 103, 104, 105 in a generally perpendicular direction relative to the base 101*a*. That is, only the lower portions of the plurality of sides 103, 104, 105 overlap the peripheral wall 101*b* of the holder 101. In some embodiments, each of two parallel sides of the peripheral wall 101*b* has two sections, a first section extending from a middle side of the peripheral wall 101*b* and a second section extending from the first section. In some embodiments, the first section is thicker than the second section such that a distance between the first sections is less than a distance between the second sections. In some embodiments, the inner surface of the second and third sides of the foldable unit 102 contacting the inner surface of the second sections is aligned with the inner surface of the first sections when the foldable unit 102 is in the open configuration, as shown in FIGS. 1A and 1B.

In some embodiments, each of the second side 104 and the third side 105 is generally perpendicular to the first side 103 when the foldable unit 102 is in the open configuration, as shown in FIGS. 1A and 1B. Further, each of the second side 104 and the third side 105 is parallel to the first side 103 when the foldable unit 102 is in the closed configuration, as shown in FIG. 2E.

In some embodiments, each of the plurality of springs 106*a*, 106*b* is a torsion spring. For example, each torsion spring 106*a*, 106*b* has a first leg and a second leg. The first leg is generally perpendicular to the second leg in the open configuration, as shown in FIGS. 1A and 1B. Further, the first leg of the torsion spring 106*a*, 106*b* is generally parallel to the second leg in the closed configuration, as shown in FIG. 2E (the torsion spring 106*a*, 106*b* not actually shown in FIG. 2E). In some embodiments, the first leg of the first spring 106*a* is attached to the first side 103 and the second leg of the first spring 106*a* is attached to the second side 104. Further, the first leg of the second spring 106*b* is attached to the first side 103 and the second leg of the second spring 106*b* is attached to the third side 105.

Referring to FIGS. 1A and 1B, in some embodiments, the plurality of springs further includes a third spring 106*c*. For example, the third spring 106*c* is also a torsion spring. In some embodiments, the first, second, and third springs 106*a*, 106*b*, 106*c* are the same type and same size. The third spring 106*c* includes respective first and second legs. As shown in FIGS. 1A and 1B, the first leg of the third spring 106*c* is attached to the first side 103, and the second leg of the third spring 106*c* is attached to the base 101*a* of the holder 101.

Referring to FIGS. 1A and 1B, in some embodiments, the supporting assembly 100 further includes an elastic member 107. In some embodiments, a first end of the elastic member 107 is coupled to the peripheral wall 101*b* of the holder 101. In some embodiments, the elastic member 107 protrudes from the peripheral wall 101*b* of the holder 101 and elongated such that the elastic member 107 is parallel to the second and third sides 104, 105 of the foldable unit 102.

Referring to FIGS. 1A and 1B, in some embodiments, the supporting assembly 100 further includes a latch 108 coupled to a second end of the elastic member 107. In some embodiments, the latch 108 is made of metal such that abrasion, crack, and distortion are prevented. The latch 108 is configured to hold the foldable unit 102 in the closed configuration once the foldable unit 102 is completely folded and placed in the closed configuration by suppressing the first, second, and third springs 106*a*, 106*b*, 106*c* from being released or unwound.

The foldable unit 102 is folded by wounding the first, second, and third springs 106*a*, 106*b*, 106*c*. FIGS. 2A-2E show steps of folding the foldable unit 102 of the supporting assembly 100. As shown in FIG. 2A, all of the first, second, and third sides 103, 104, 105 of the foldable unit 102 are perpendicular to the base 101*a* of the holder 101 when the foldable unit 102 is in a completely open configuration. As shown in FIG. 2B, the first side 103 of the foldable unit 102 that is in the open configuration is configured to tilt toward the base 101*a* of the holder 101 in response to pressure (P) applied to the foldable unit 102 or the first side 103 of the foldable unit 102. The second side 104 and the third side 105 of the foldable unit 102 are configured to be folded toward the first side 103 as the first side 103 is tilted in response to the pressure (P). See FIG. 2C.

Coils of the first, second, and third springs 106*a*, 106*b*, 106*c* are wound when the second side 104 and the third side 105 are folded. As shown in FIGS. 2C and 2D, the foldable unit 102 tilting in response to the pressure (P) is configured to eventually contact and push the latch 108 such that the elastic member 107 is compressed. Then, the latch 108 moves from a first position to a second position, and the foldable unit 102 is eventually locked by the latch 108 placed on top of the folded foldable unit 102 when the latch 108 returns to the first position, as shown in FIG. 2E.

Releasing the latch 108 and converting the foldable unit 102 from the closed configuration to the open configuration is performed as shown in FIGS. 2E-2A. That is, the foldable unit 102 that is in the closed configuration is configured to return to the open configuration in response to release of the latch 108. For example, the latch 108 is released in response to pressure applied to the latch and compressing the elastic member 107. The direction of the pressure for releasing the latch 108 is opposite the direction of the arrow shown in FIG. 2E.

Once the latch 108 is released, the second side 104 and the third side 105 of the foldable unit 102 are configured to be unfolded to place the foldable unit 102 in the open configuration in response to unwinding of coils of the first, second, and third springs 106*a*, 106*b*, 106*c*. Eventually, the foldable unit 102 is placed in the open configuration, as shown in FIG. 2A.

Figure 3A:
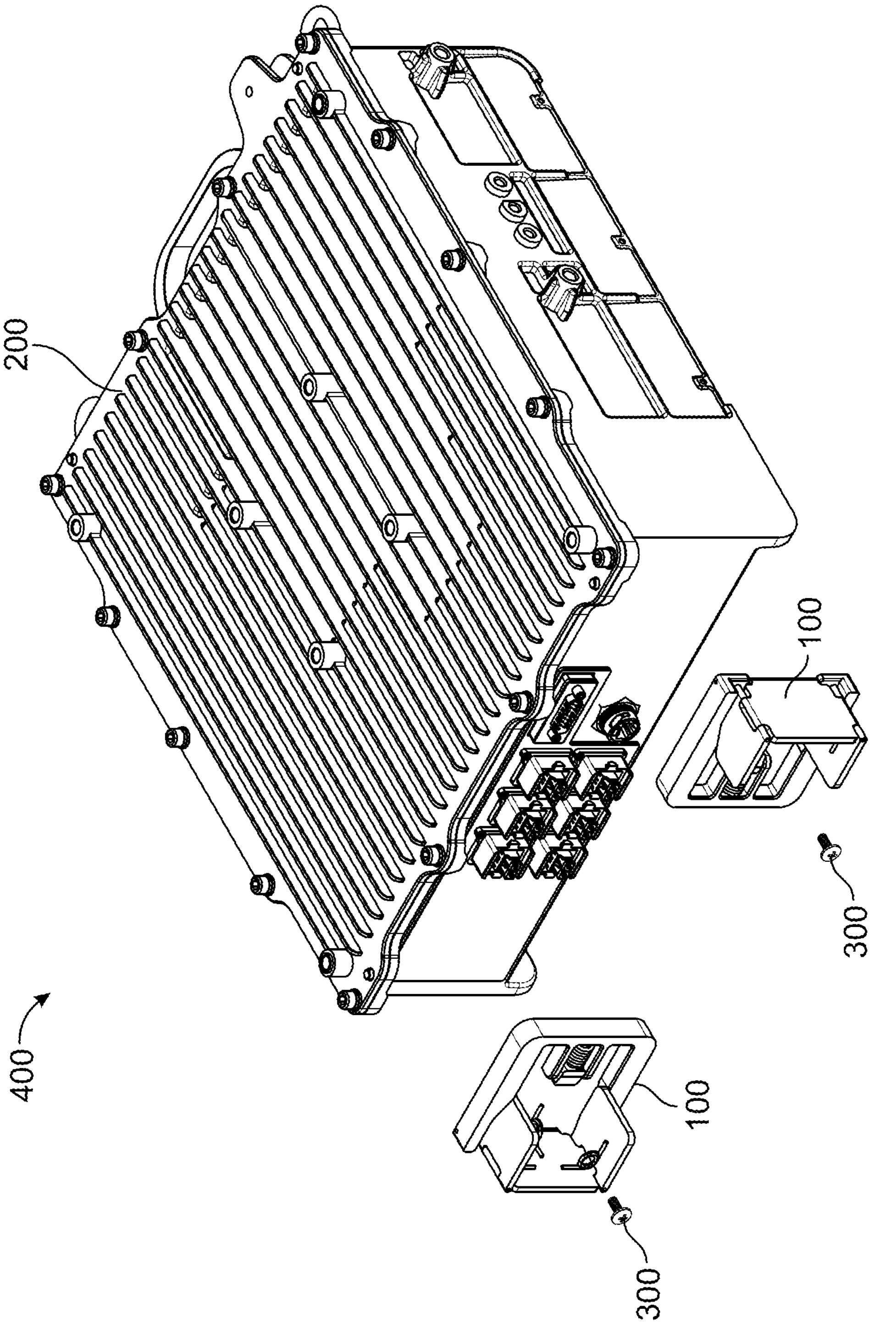
FIGS. 3A and 3B show coupling of a supporting assembly to an outdoor computing system, according to certain aspects of the present disclosure.
Figure 3B:
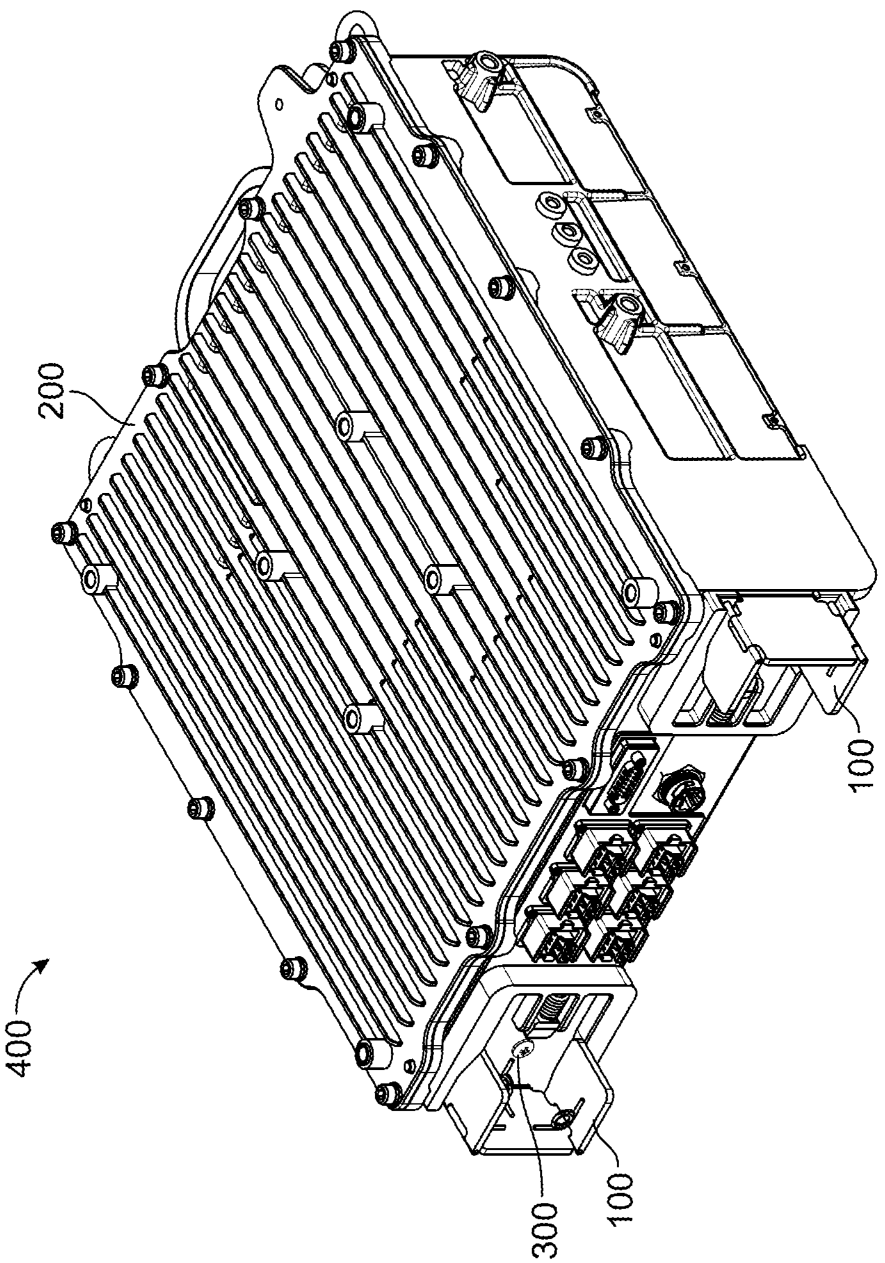

Referring to FIGS. 3A and 3B, in various embodiments, a telecommunication system 400 includes an outdoor computing/communication device 200 and the supporting assembly 100 coupled to one side, for example a bottom side, of the outdoor computing/communication device 200. For example, the supporting assembly 100 is fixed to the side of the outdoor computing/communication device 200 by at least one fastener 300 such as a screw. In some embodiments, a plurality of supporting assemblies 100, for example 2 supporting assemblies 100, are coupled to one side of the outdoor computing/communication device 200, as exemplified in FIGS. 3A and 3B.

Figure 4A:
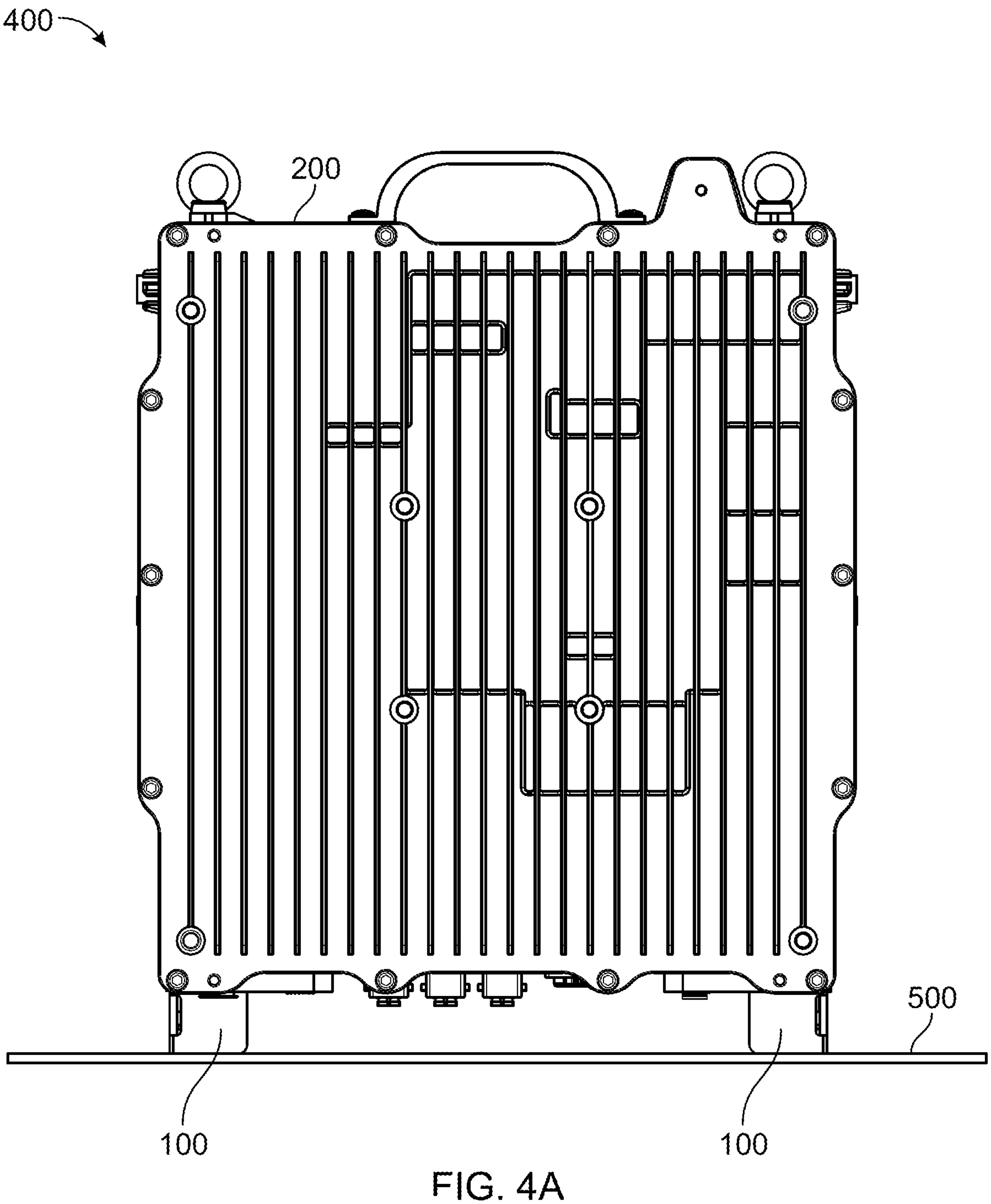
FIG. 4A shows a side view of a supporting assembly with a foldable unit in an open configuration, the supporting assembly coupled to an outdoor computing system, according to certain aspects of the present disclosure.
Figure 4B:
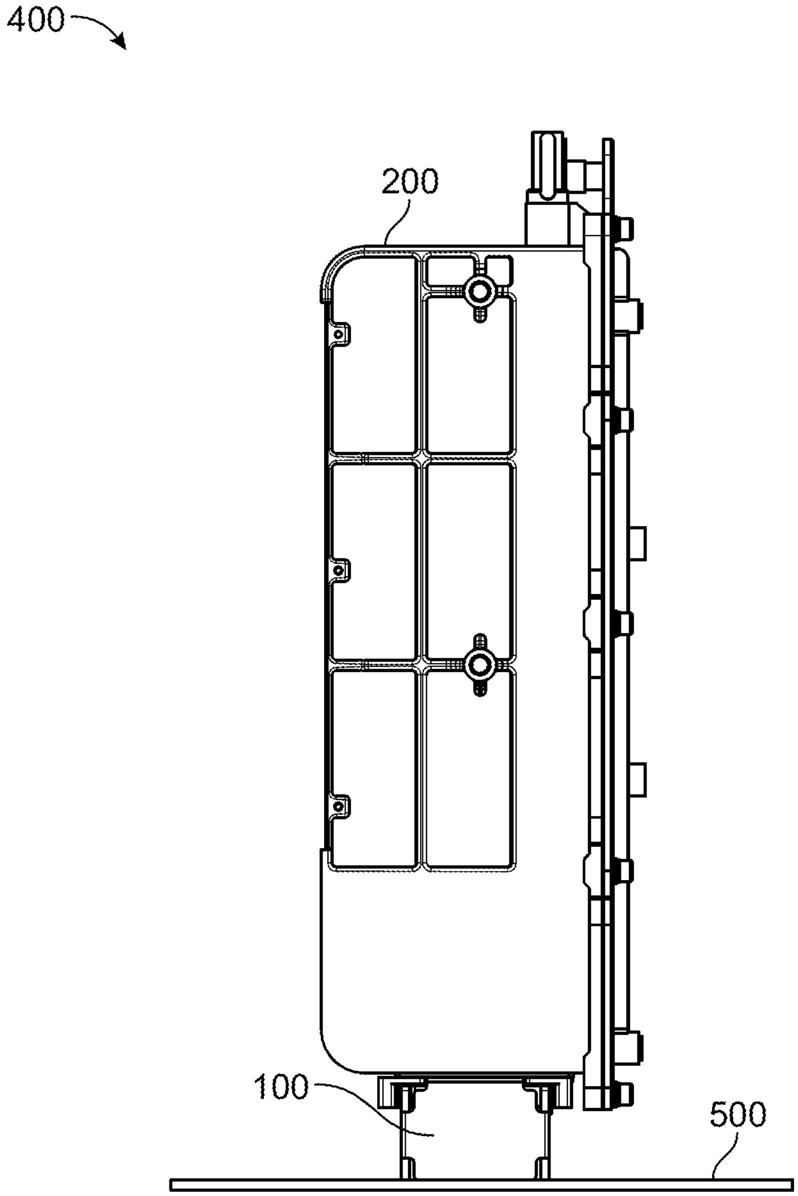
FIG. 4B shows a rear view of a supporting assembly with a foldable unit in an open configuration, the supporting assembly coupled to an outdoor computing system, according to certain aspects of the present disclosure.
Figure 4C:
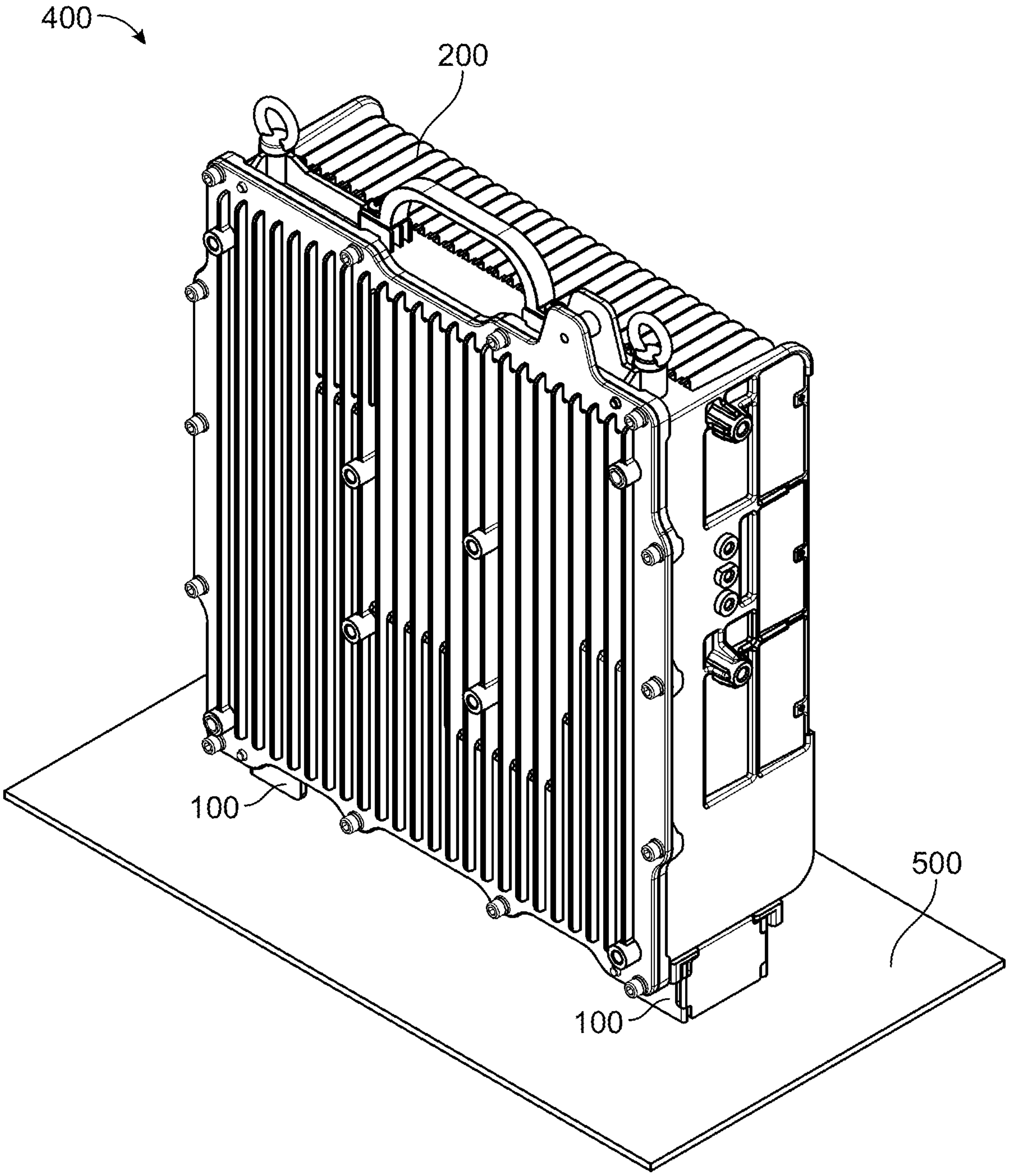
FIG. 4C shows a perspective view of a supporting assembly with a foldable unit in an open configuration, the supporting assembly coupled to an outdoor computing system, according to certain aspects of the present disclosure.

As shown in FIGS. 4A-4C, the supporting assembly 100 is configured to prevent direct contact between an exterior surface of the outdoor computing/communication device 200 and a surface 500 on which the outdoor computing/communication device 200 is placed. Thus, damages, such as paint peeling and scratches, to the exterior surface of the outdoor computing/communication device 200 can be prevented. In FIGS. 4A-4C, it is noted that the supporting assembly 100 or the foldable unit 102 is in the open configuration to provide a space between the exterior surface of the outdoor computing/communication device 200 and the surface 500. For example, even if there is water on the surface 500, the exterior surface of the outdoor computing/communication device 200 will not contact the water on the surface 500 thanks to the supporting assembly 100.

Figure 5A:
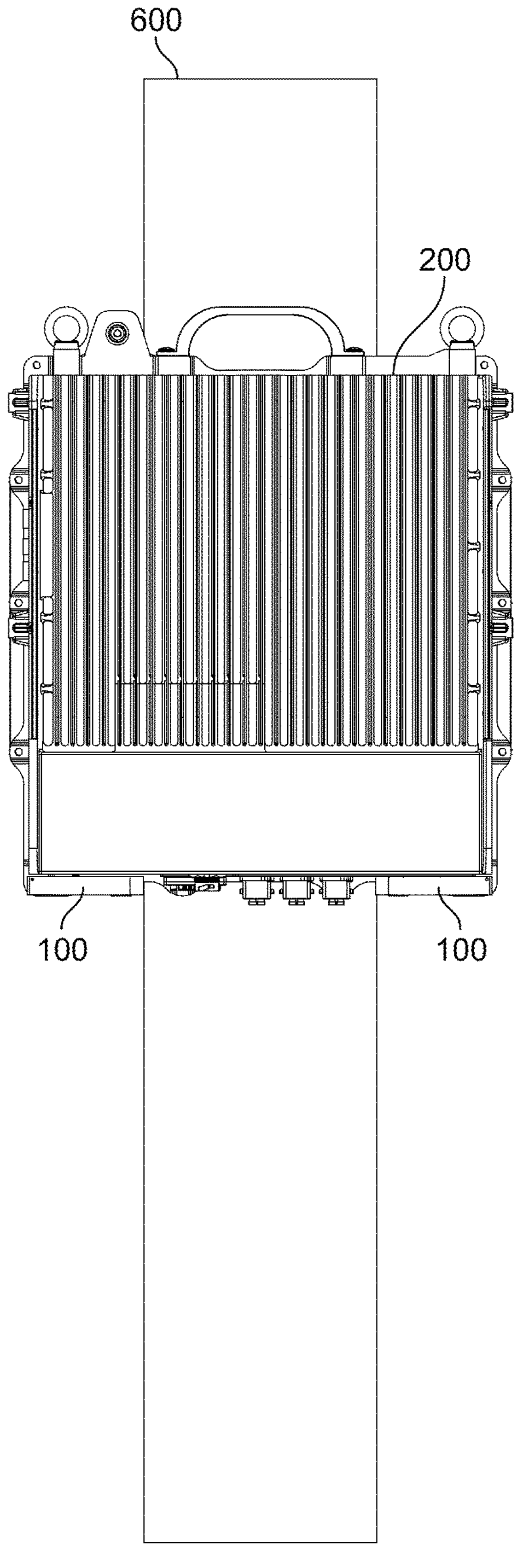
FIG. 5A shows a side view of a supporting assembly with a foldable unit in a closed configuration, the supporting assembly coupled to an outdoor computing system, according to certain aspects of the present disclosure.
Figure 5B:
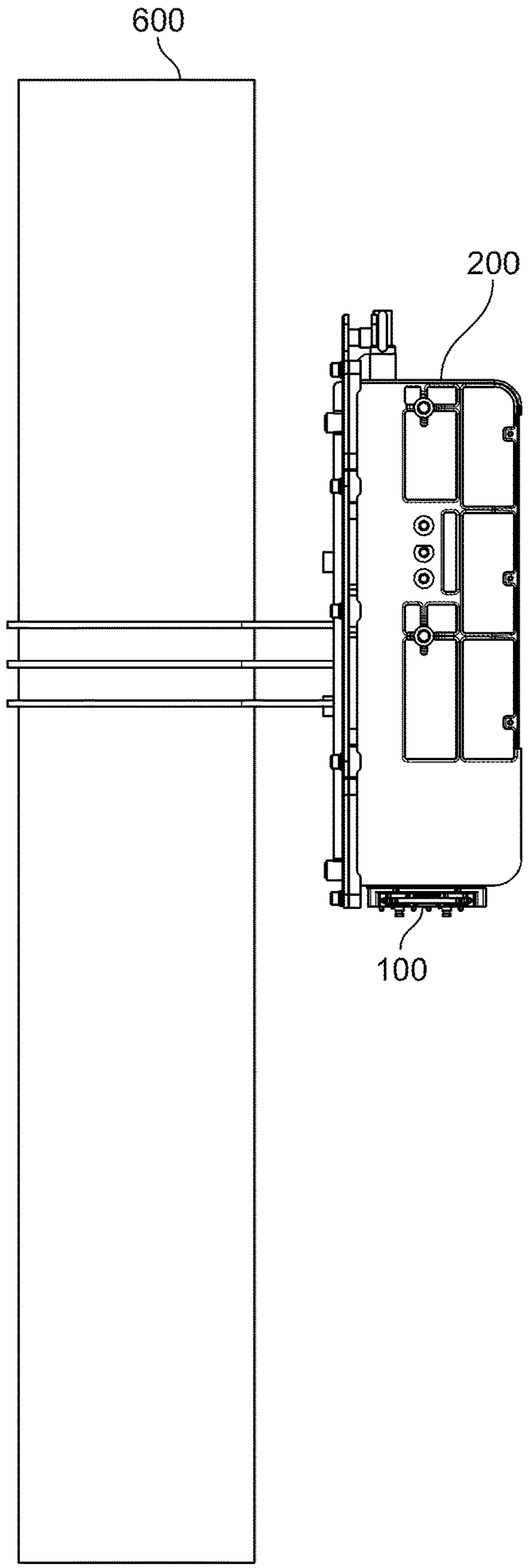
FIG. 5B shows a rear view of a supporting assembly with a foldable unit in a closed configuration, the supporting assembly coupled to an outdoor computing system, according to certain aspects of the present disclosure.
Figure 5C:
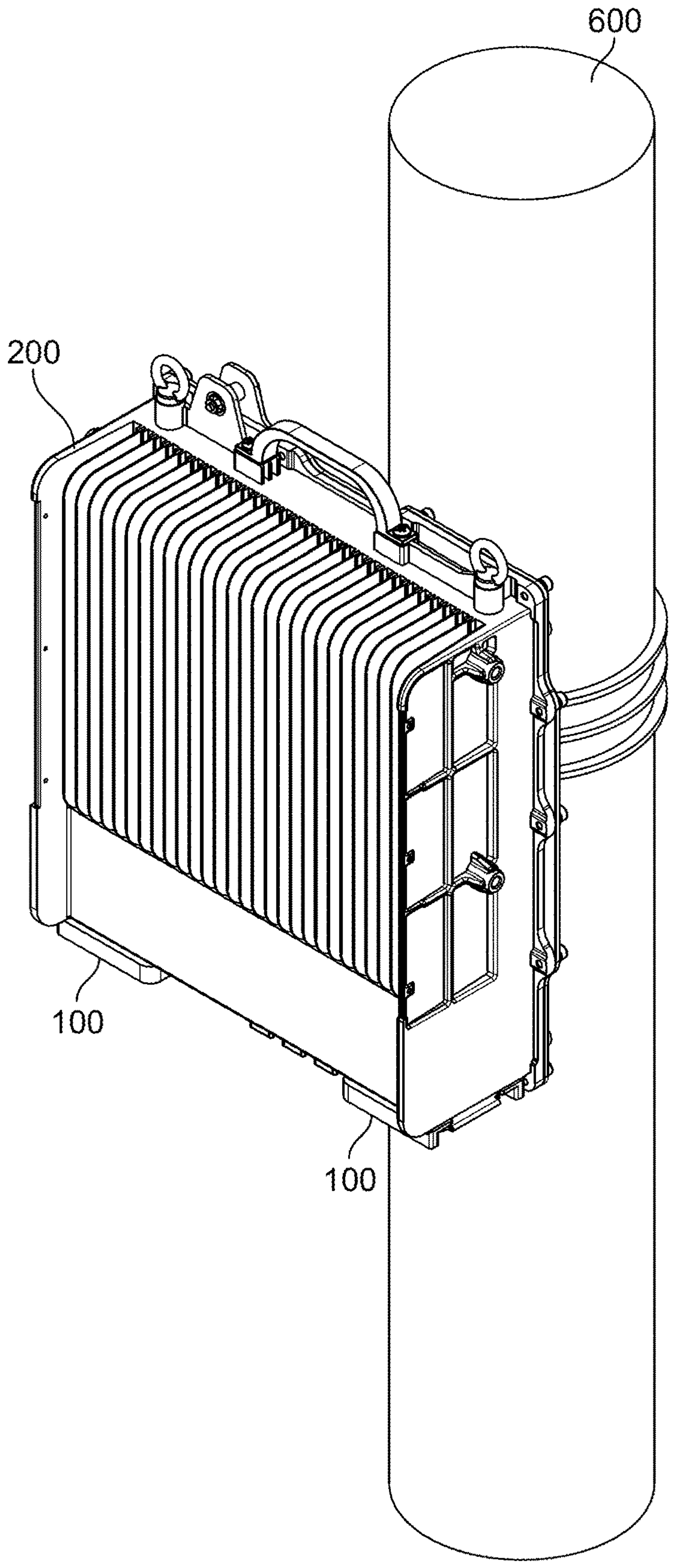
FIG. 5C shows a perspective view of a supporting assembly with a foldable unit in a closed configuration, the supporting assembly coupled to an outdoor computing system, according to certain aspects of the present disclosure.

Referring to FIGS. 5A-5C, in various embodiments, the foldable unit 102 coupled to one side of the outdoor computing/communication device 200 is in the closed configuration, when the exterior surface or bottom surface of the outdoor computing/communication device 200 does not need to contact another surface. For example, when the outdoor computing/communication device 200 is directly coupled to a pole structure 600 without requiring another surface to support the outdoor computing/communication device 200, the foldable unit 102 does not need to be in the open configuration. Alternatively, the supporting assembly 100 can be detached from the side of the outdoor computing/communication device 200 when the outdoor computing/communication device 200 is directly coupled to the pole structure 600. Further, the supporting assembly 100 can be placed in the closed configuration to provide a technician more space for cable installation and/or operation.

As described above, it is very easy to open or close the inventive supporting assembly such that a technician can manipulate the supporting assembly without requiring any tools. Further, the easy opening/closing mechanism of the supporting assembly can provide a quick access to the outdoor computing/communication device when a technician services the telecommunication system. Furthermore, by placing the supporting assembly in the closed configuration, the size of the telecommunication system can be reduced so that a technician can have more space for installation of cables and operation of the same. Moreover, the supporting assembly can be easily attached to or detached from the outdoor computing/communication device, as necessary. Therefore, the supporting assembly provides a very convenient and cost-effective way of preventing damages to the exterior surface of the outdoor computing/communication device.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular examples only and is not intended to be limiting of the disclosure. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this disclosure belongs. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A supporting assembly for an outdoor computing system, the supporting assembly comprising:

a holder having a base from which a peripheral wall extends;

a foldable unit mechanically attached to the holder within the peripheral wall, the foldable unit having a plurality of sides that include a first side, a second side connected to the first side, the second side being movable relative to the first side, and a third side connected to the first side, the third side being movable relative to the first side; and a plurality of springs including a first spring and a second spring, the first spring being attached between the first side and the second side, the second spring being attached between the first side and the third side, wherein the foldable unit is configured to change between an open configuration and a closed configuration, the foldable unit being maintained in the open configuration solely by the plurality of springs, wherein each of the plurality of springs is a torsion spring, wherein each said torsion spring has a first leg and a second leg, the first leg being generally perpendicular to the second leg in the open configuration, the first leg being generally parallel to the second leg in the closed configuration, wherein:

the first leg of the first spring is attached to the first side and the second leg of the first spring is attached to the second side, and the first leg of the second spring is attached to the first side and the second leg of the second spring is attached to the third side, and wherein the plurality of springs further includes a third spring, the third spring being a torsion spring and including respective first and second legs, the first leg of the third spring being attached to the first side, the second leg of the third spring being attached to the base of the holder.

2. The supporting assembly of claim 1, wherein the peripheral wall overlaps only a portion of the plurality of sides in a generally perpendicular direction relative to the base.

3. The supporting assembly of claim 1, wherein each of the second side and the third side is generally perpendicular to the first side when the foldable unit is in the open configuration.

4. The supporting assembly of claim 3, wherein each of the second side and the third side is parallel to the first side when the foldable unit is in the closed configuration.

5. The supporting assembly of claim 1, further comprising an elastic member, a first end of the elastic member coupled to the peripheral wall of the holder.

6. The supporting assembly of claim 5, wherein the elastic member protruding from the peripheral wall of the holder is elongated such that the elastic member is parallel to the second and third sides of the foldable unit.

7. The supporting assembly of claim 5, further comprising a latch coupled to a second end of the elastic member.

8. The supporting assembly of claim 7, wherein the first side of the foldable unit that is in the open configuration is configured to tilt toward the base of the holder in response to pressure applied to the foldable unit or the first side of the foldable unit.

9. The supporting assembly of claim 8, wherein the second side and the third side are configured to be folded toward the first side as the first side is tilted in response to the pressure.

10. The supporting assembly of claim 9, wherein coils of the first, second, and third springs are wound when the second side and the third side are folded.

11. The supporting assembly of claim 10, wherein the foldable unit placed in the closed configuration in response to the pressure is configured to contact and push the latch such that the elastic member is compressed, the latch moves from a first position to a second position, and the foldable unit is eventually locked by the latch placed on top of the folded foldable unit when the latch returns to the first position.

12. The supporting assembly of claim 11, wherein the foldable unit that is in the closed configuration is configured to return to the open configuration in response to release of the latch, the latch released in response to pressure applied to the latch and compressing the elastic member.

13. The supporting assembly of claim 12, wherein the second side and the third side of the foldable unit are configured to be unfolded to place the foldable unit in the open configuration in response to unwinding of coils of the first, second, and third springs.

14. A telecommunication system comprising:

an outdoor computing/communication device; and the supporting assembly of claim 1 coupled to a side of the outdoor computing/communication device.

15. The telecommunication system of claim 14, wherein the supporting assembly is configured to prevent direct contact between an exterior surface of the outdoor computing/communication device and a surface on which the outdoor computing/communication device is placed.

16. The telecommunication system of claim 15, wherein the supporting assembly coupled to the outdoor computing/communication device is placed on the surface with the foldable unit in the open configuration.

17. A supporting assembly for an outdoor computing system, the supporting assembly comprising:

a holder having a base from which a peripheral wall extends;

a foldable unit mechanically attached to the holder within the peripheral wall, the foldable unit having a plurality of sides that include a first side, a second side connected to the first side, the second side being movable relative to the first side, and a third side connected to the first side, the third side being movable relative to the first side; and a plurality of torsion springs including a first spring, a second spring, and a third spring, the first spring being attached between the first side and the second side, the second spring being attached between the first side and the third side, the third spring being attached between the first side and the base of the holder;

wherein the foldable unit is configured to change between an open configuration and a closed configuration, the foldable unit being maintained in the open configuration solely by the plurality of springs.

* * * * *